US009519020B2

(12) United States Patent
Ko et al.

(10) Patent No.: US 9,519,020 B2
(45) Date of Patent: Dec. 13, 2016

(54) SEMICONDUCTOR APPARATUS AND CHIP SELECTING METHOD THEREOF

(71) Applicant: SK hynix Inc., Icheon-si Gyeonggi-do (KR)

(72) Inventors: Jae Bum Ko, Icheon-si (KR); Jun Gi Choi, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 727 days.

(21) Appl. No.: 13/760,242

(22) Filed: Feb. 6, 2013

(65) Prior Publication Data

US 2013/0151176 A1 Jun. 13, 2013

Related U.S. Application Data

(63) Continuation-in-part of application No. 12/839,356, filed on Jul. 19, 2010, now abandoned.

(30) Foreign Application Priority Data

Mar. 31, 2010 (KR) .................. 10-2010-0029068

(51) Int. Cl.
| | |
|---|---|
| *G06F 17/00* | (2006.01) |
| *G01R 31/26* | (2014.01) |
| *G11C 29/00* | (2006.01) |
| *G11C 8/12* | (2006.01) |
| *G11C 29/02* | (2006.01) |
| *H01L 25/065* | (2006.01) |

(52) U.S. Cl.
CPC ........... *G01R 31/2607* (2013.01); *G06F 17/00* (2013.01); *G11C 8/12* (2013.01); *G11C 29/027* (2013.01); *G11C 29/785* (2013.01); *G11C 29/848* (2013.01); *G11C 29/883* (2013.01); *H01L 25/0657* (2013.01); *H01L 2225/06527* (2013.01); *H01L 2924/0002* (2013.01)

(58) Field of Classification Search
CPC .............. G01R 31/31723; G01R 31/26; G01R 31/1272; G01R 31/1227; G01R 31/02; G01R 31/028; G01R 31/2607; G06F 17/00; G11C 29/027; G11C 29/785; G11C 29/848; G11C 29/883; H01L 2225/06527; H01L 2924/0002; H01L 25/0657
USPC ......................................................... 702/120
See application file for complete search history.

(56) References Cited

U.S. PATENT DOCUMENTS

| | | | | |
|---|---|---|---|---|
| 7,492,623 | B2 * | 2/2009 | Lee ................................. | 365/96 |
| 8,076,764 | B2 * | 12/2011 | Yamada et al. ............... | 257/686 |
| 2009/0158087 | A1 * | 6/2009 | Maeno et al. ..................... | 714/6 |
| 2009/0231897 | A1 * | 9/2009 | Ryu et al. ........................ | 365/51 |

* cited by examiner

*Primary Examiner* — John Breene
*Assistant Examiner* — Lynda Dinh
(74) *Attorney, Agent, or Firm* — William Park & Associates Ltd.

(57) ABSTRACT

A semiconductor apparatus includes an individual chip designating code setting block configured to generate a plurality of individual chip designating code of different values; an individual chip activation block configured to enable an individual chip activation signal among a plurality of individual chip activation signals, which corresponds to individual chip designating code, when the individual chip designating code matches the individual chip control code; and a control block configured to set the individual chip control code or output chip selection address as the individual chip control code in response to chip selection fuse signals and test fuse signals.

9 Claims, 9 Drawing Sheets

210

SEMICONDUCTOR APPARATUS AND CHIP SELECTING METHOD THEREOF

CROSS-REFERENCES TO RELATED APPLICATION

The application is a continuation-in-part of application Ser. No. 12/839,356, filed Jul. 19, 2010, titled "Semiconductor apparatus and chip selecting method thereof", which is incorporated here in by reference in its entirety as if set forth in full.

BACKGROUND

1. Technical Field

The present invention relates to a semiconductor integrated circuit, and more particularly, to a semiconductor apparatus with a plurality of stacked individual chips and a method of selecting an individual chip thereof.

2. Related Art

A semiconductor apparatus is designed to operate at a high speed and have a large data storage capacity.

These goals may be met by stacking individual chips in wafer levels and packaging the stacked chips as an individual product.

The individual chips in the stack are typically assigned addresses, and data is stored in the chips according to the assigned addresses.

When assigning addresses to the individual stacked chips, the values of codes consisting of a plurality of bits are sequentially increased or decreased.

Stacking individual chips and sequentially increasing or decreasing code values assigned as addresses are used on the assumption that the individual stacked chips have not failed.

However, if at least one of the individual stacked chips has failed, none of the stacked chips may be used. For example, in a semiconductor apparatus which is stacked and packaged into eight layers, if even one individual chip fails, the remaining seven chips cannot be used, which leads to loss of efficiency and productivity.

SUMMARY

A semiconductor apparatus is described herein in which a plurality of individual chips are stacked and, even if at least one individual stacked chip has failed, the remaining chips may be used.

In one embodiment of the present invention, the semiconductor apparatus includes: an individual chip designating code setting block configured to generate a plurality of individual chip designating codes of different values; an individual chip activation block configured to enable an individual chip activation signal from among a plurality of individual chip activation signals, wherein the enabled individual chip activation signal corresponds to an individual chip designating code when one of the individual chip designating codes matches the individual chip control code; and a control block configured to set the individual chip control code or output a chip selection address as the individual chip control code in response to chip selection fuse signals and test fuse signals.

In another embodiment of the present invention, an individual chip selection method of a semiconductor apparatus, for generating a plurality of individual chip designating codes having different code values, comparing the respective generated individual chip designating code with chip selection address, and enabling one of a plurality of individual chip activation signals, includes the steps of: determining a number of individual chip activation signals among the plurality of individual chip activation signals, which are enabled according to the chip selection address, in response to a chip selection fuse signal; and dividing the plurality of individual chip activation signals into a plurality of groups by the number of individual chip activation signals determined in the determining step and selecting one of the groups in response to a test fuse signal.

In another embodiment of the present invention, the semiconductor apparatus includes: a chip identification block configured to generate a plurality of chip identification codes, the plurality of chip identification codes being different from each other; a control block that receives a chip selection address and chip selection fuse signals, the control block being configured to output a chip selection address as a chip control code in response to the chip selection fuse signals; and a chip activation block that outputs a plurality of chip activation signals, the chip activation block being configured to enable one of the plurality of chip activation signals that corresponds to the chip identification code matching the chip control code.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and chip selection method thereof according to the present invention will be described below with reference to the accompanying drawings through exemplary embodiments.

Figure 1:
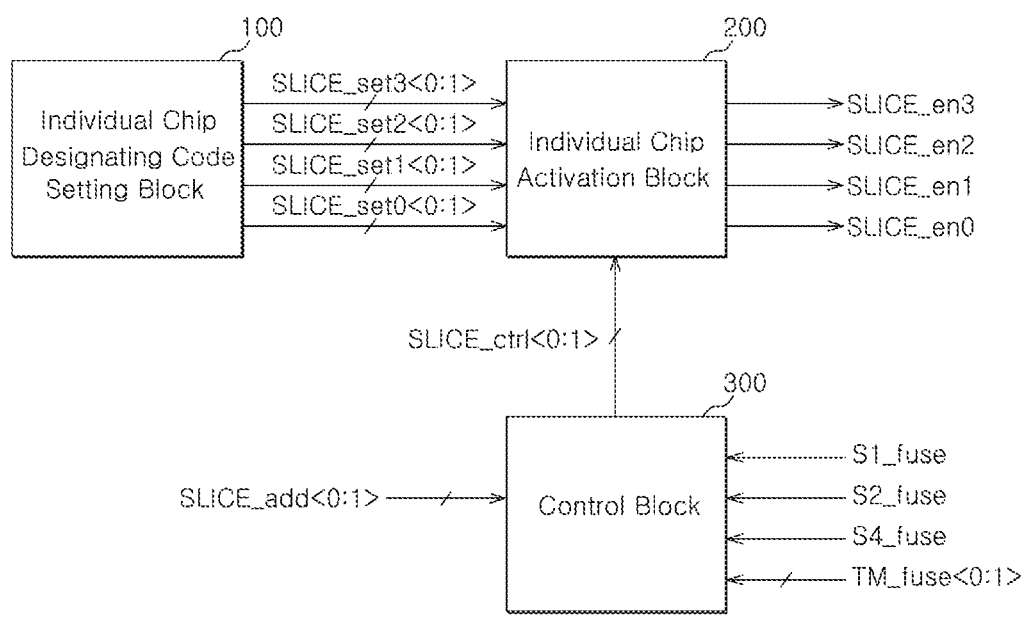
FIG. 1 is a block diagram illustrating a semiconductor apparatus in accordance with an embodiment of the present invention.

FIG. 1 is a block diagram illustrating a semiconductor apparatus in accordance with an embodiment of the present invention. Referring to FIG. 1, a semiconductor apparatus in accordance with the embodiment includes an individual chip designating code setting block 100, an individual chip activation block 200, and a control block 300.

The individual chip designating code setting block 100 is configured to generate first through fourth individual chip designating codes SLICE_set0<0:1>-SLICE_set3<0:1>. The individual chip designating code setting block 100 generates the first through fourth individual chip designating codes SLICE_set0<0:1>-SLICE_set3<0:1> which have different code values each other. For example, the individual chip designating code setting block 100 may be configured such that the first individual chip designating code SLICE_set0<0:1> has a code value of 00, the second individual chip designating code SLICE_set1<0:1> has a code value of 01, the third individual chip designating code SLICE_set2<0:1> has a code value of 10, and the fourth individual chip designating code SLICE_set3<0:1> has a code value of 11. The individual chip activation block 200 is configured such that when one of the first through fourth individual chip designating codes SLICE_set0<0:1>-SLICE_set3<0:1> matches an individual chip control code SLICE_ctrl<0:1> (which are outputted from the control block 300), the corresponding one of first through fourth individual chip activation signals SLICE_en0-SLICE_en3 is enabled. For example, when the first individual chip designating code SLICE_set0<0:1> matches the individual chip control code SLICE_ctrl<0:1>, the individual chip activation block 200 enables the first individual chip activation signal SLICE_en0.

The control block 300 is configured to set the individual chip is control code SLICE_ctrl<0:1> or output a chip selection address SLICE_add<0:1> as the individual chip control code SLICE_ctrl<0:1> in response to first through third chip selection fuse signals S1_fuse, S2_fuse and S4_fuse, and test fuse signals TM_fuse<0:1>.

Figure 2:
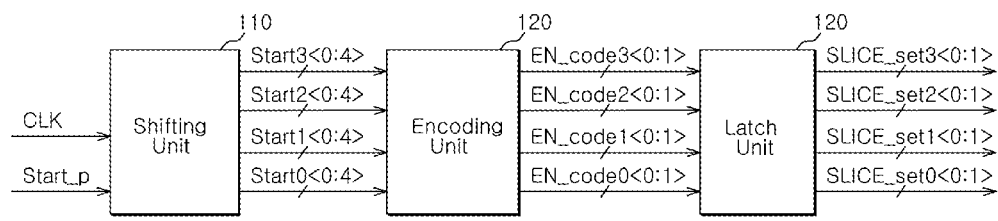
FIG. 2 is a configuration diagram of the individual chip designating code setting block of FIG. 1.

Referring to FIG. 2, the individual chip designating code setting block includes a shifting unit 110, an encoding unit 120, and a latch unit 130.

The shifting unit 110 is configured to receive a clock CLK and a start pulse start_p and generate first to fourth start codes start0<0:4>, start1<0:4>, start2<0:4> and start3<0:4>.

Figure 3:
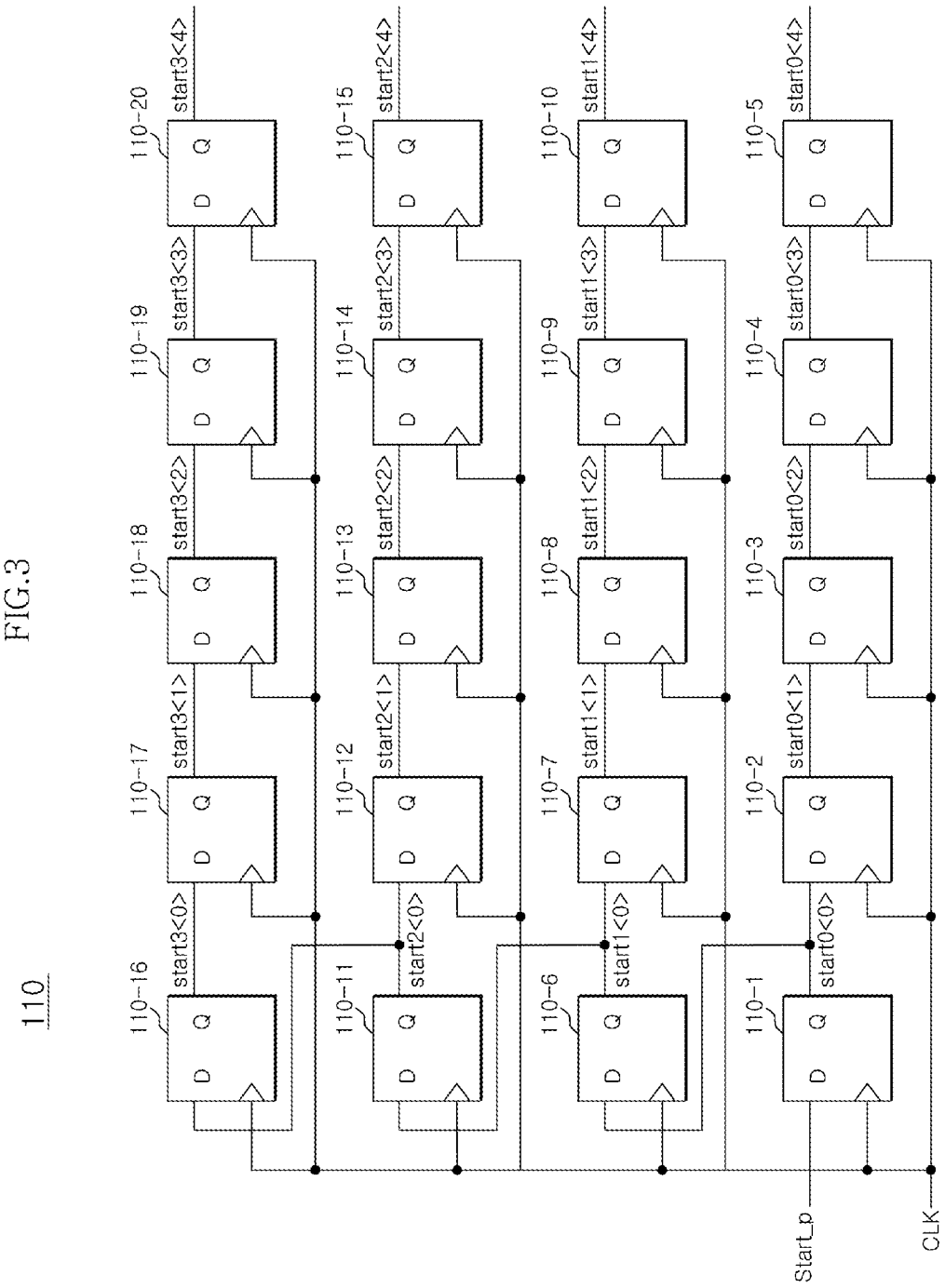
FIG. 3 is a configuration diagram of the shifting unit of FIG. 2.

Referring to FIG. 3, the shifting unit 110 includes first to twentieth flip-flops 110-1 to 110-20. The first to fifth flip-flops 110-1, 110-2, 110-3, 110-4 and 110-5 are connected in series, and the first flip-flop 110-1 receives the start pulse start_p. The first to fifth flip-flops 110-1, 110-2, 110-3, 110-4 and 110-5 respectively operate in response to the clock CLK. The first flip-flop 110-1 outputs the first bit start0<0> among the first start codes start0<0:4>. The second flip-flop 110-2 outputs the second bit start0<1> among the first start codes start0<0:4>. The third flip-flop 110-3 outputs the third bit start0<2> among the first start codes start0<0:4>. The fourth flip-flop 110-4 outputs the fourth bit start0<3> among the first start codes start0<0:4>. The fifth flip-flop 110-5 outputs the fifth bit start0<4> among the first start codes start0<0:4>. The sixth to tenth flip-flops 110-6, 110-7, 110-8, 110-9 and 110-10 are connected in series, and the sixth flip-flop 110-6 receives the output signal start0<0> of the first flip-flop 110-1. The sixth to tenth flip-flops 110-6, 110-7, 110-8, 110-9 and 110-10 respectively operate in response to the clock CLK. The sixth flip-flop 110-6 outputs the first bit start1<0> among the second start codes start1<0:4>. The seventh flip-flop 110-7 outputs the second bit start1<1> among the second start codes start1<0:4>. The eighth flip-flop 110-8 outputs the third bit start1<2> among the second start codes start1<0:4>. The ninth flip-flop 110-9 outputs the fourth bit start1<3> among the second start codes start1<0:4>. The tenth flip-flop 110-10 outputs the fifth bit start1<4> among the second start codes start1<0:4>. The eleventh to fifteenth flip-flops 110-11, 110-12, 110-13, 110-14 and 110-15 are connected in series, and the eleventh flip-flop 110-11 receives the output signal start1<0> of the sixth flip-flop 110-6. The eleventh to fifteenth flip-flops 110-11, 110-12, 110-13, 110-14 and 110-15 respectively operate in response to the clock CLK. The eleventh flip-flop 110-11 outputs the first bit start2<0> among the third start codes start2<0:4>. The twelfth flip-flop 110-12 outputs the second bit start2<1> among the third start codes start2<0:4>. The thirteenth flip-flop 110-13 outputs the third bit start2<2> among the third start codes start2<0:4>. The fourteenth flip-flop 110-14 outputs the fourth bit start2<3> among the third start codes start2<0:4>. The fifteenth flip-flop 110-15 outputs the fifth bit start2<4> among the third start codes start2<0:4>. The sixteenth to twentieth flip-flops 110-16, 110-17, 110-18, 110-19 and 110-20 are connected in series, and the sixteenth flip-flop 110-16 receives the output signal start2<0> of the eleventh flip-flop 110-11. The sixteenth to twentieth flip-flops 110-16, 110-17, 110-18, 110-19 and 110-20 respectively operate in response to the clock CLK. The sixteenth flip-flop 110-16 outputs the first bit start3<0> among the fourth start codes start3<0:4>. The seventeenth flip-flop 110-17 outputs the second bit start3<1> among the fourth start codes start3<0:4>. The eighteenth flip-flop 110-18 outputs the third bit start3<2> among the fourth start codes start3<0:4>. The nineteenth flip-flop 110-19 outputs the fourth bit start3<3> among the fourth start codes start3<0:4>. The twentieth flip-flop 110-20 outputs the fifth bit start3<4> among the fourth start codes start3<0:4>.

After the start pulse start_p which transitions to a high level at a preset time is inputted to the shifting unit 110, 5 cycles of the clock CLK elapse. At this time, by enumerating the code values of the first start codes start0<0:4> from the first bit to the fifth bit, the first start codes start0<0:4> may have the value of (0,0,0,0,1). By enumerating the code values of the second start codes start1<0:4> from the first bit to the fifth bit, the second start codes start1<0:4> may have the value of (0,0,0,1,0). By enumerating the code values of the third start codes start2<0:4> from the first bit to the fifth bit, the third start codes start2<0:4> may have the value of (0,0,1,0,0). By enumerating the code values of the fourth start codes start3<0:4> from the first bit to the fifth bit, the fourth start codes start3<0:4> may have the value of (0,1,0,0,0).

The encoding unit 120 is configured to encode the first to fourth start codes start0<0:4> to start3<0:4> and generate first to fourth activation codes EN_code0<0:1>, EN_code1<0:1>, EN_code2<0:1> and EN_code3<0:1>. The first activation codes EN_code0<0:1> may have the code value of (0,0). The second activation codes EN_code1<0:1> may have the code value of (0,1). The third activation codes EN_code2<0:1> may have the code value of (1,0). The fourth activation codes EN_code3<0:1> may have the code value of (1,1). That is to say, the first to fourth activation codes EN_code0<0:1>, EN_code1<0:1>, EN_code2<0:1> and EN_code3<0:1> may be generated to have difference code values.

Figure 4:
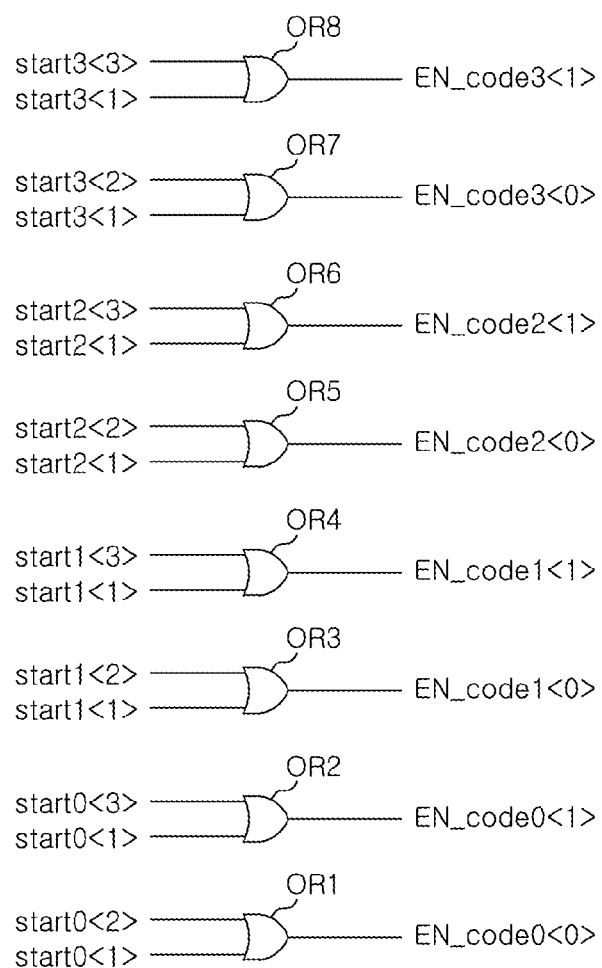
FIG. 4 is a configuration diagram of the encoding unit of FIG. 2.

Referring to FIG. 4, the encoding unit 120 includes first to eighth OR gates OR1 to OR8. The first OR gate OR1 receives the second and third bits start0<1> and start0<2> of the first start codes start0<0:4> and outputs the first bit EN_code0<0> of the first activation codes EN_code0<0:1>. The second OR gate OR2 receives the second and fourth bits start0<1> and start0<3> of the first start codes start0<0:4> and outputs the second bit EN_code0<1> of the first activation codes EN_code0<0:1>. The third OR gate OR3 receives the second and third bits start1<1> and start1<2> of the second start codes start1<0:4> and outputs the first bit EN_code1<0> of the second activation codes EN_code1<0:1>. The fourth OR gate OR4 receives the second and fourth bits start1<1> and start1<3> of the second start codes start1<0:4> and outputs the second bit EN_code1<1> of the second activation codes EN_code1<0:1>. The fifth OR gate OR5 receives the second and third bits start2<1> and start2<2> of the third start codes start2<0:4> and outputs the first bit EN_code2<0> of the third activation codes EN_code2<0:1>. The sixth OR gate OR6 receives the second and fourth bits start2<1> and start2<3> of the third start codes start2<0:4> and outputs the second bit EN_code2<1> of the third activation codes EN_code2<0:1>. The seventh OR gate OR7 receives the second and third bits start3<1> and start3<2> of the fourth start codes start3<0:4> and outputs the first bit EN_code3<0> of the fourth activation codes EN_code3<0:1>. The eighth OR gate OR8 receives the second and third bits start3<1> and start3<3> of the fourth start codes start3<0:4> and outputs the second bit EN_code3<1> of the fourth activation codes EN_code3<0:1>.

The latch unit 130 is configured to latch the first to fourth activation codes EN_code0<0:1>, EN_code1<0:1>, EN_code2<0:1> and EN_code3<0:1> and output the first to fourth individual chip designating codes SLICE_set0<0:1>, SLICE_set1<0:1>, SLICE_set2<0:1> and SLICE_set3<0:1>.

Figure 5:
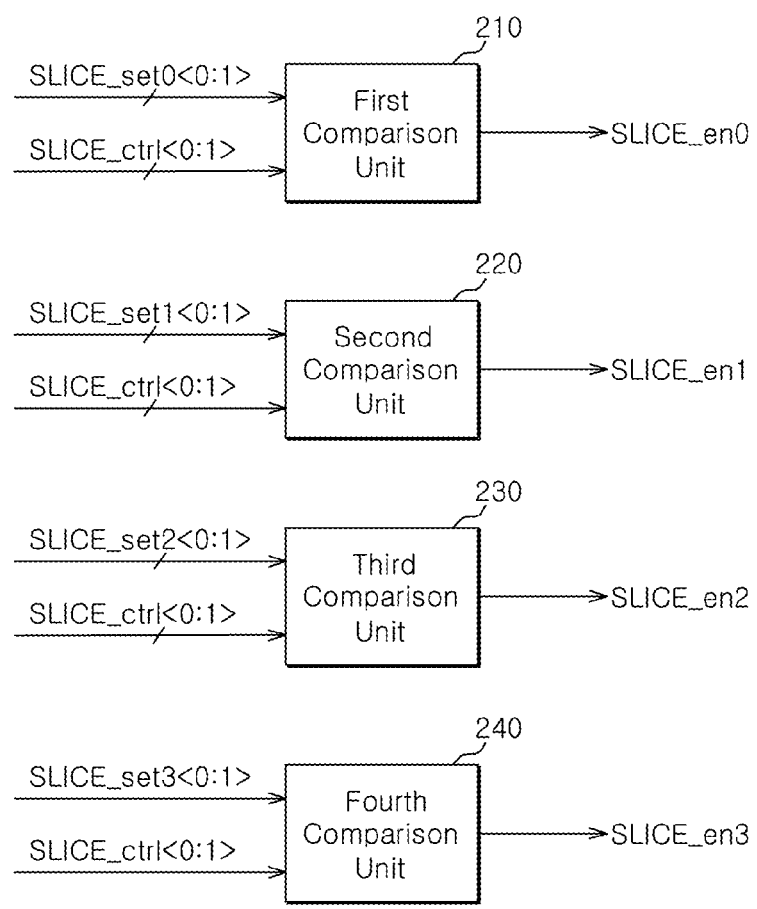
FIG. 5 is a block diagram illustrating the individual chip activation block shown in FIG. 1.

FIG. 5 is a block diagram illustrating the individual chip activation block shown in FIG. 1. Referring to FIG. 5, the individual chip activation block 200 includes first through fourth comparison units 210-240. The first comparison unit 210 is configured to enable the first individual chip activation signal SLICE_en0 when the first individual chip designating code SLICE_set0<0:1> matches the individual chip control code SLICE_ctrl<0:1>. The second comparison unit 220 is configured to enable the second individual chip activation signal SLICE_en1 when the second individual chip designating code SLICE_set1<0:1> matches the individual chip control code SLICE_ctrl<0:1>. The third comparison unit 230 is configured to enable the third individual chip activation signal SLICE_en2 when the third individual chip designating code SLICE_set2<0:1> matches the individual chip control code SLICE_ctrl<0:1>. The fourth comparison unit 240 is configured to enable the fourth individual chip activation signal SLICE_en3 when the fourth individual chip designating code SLICE_set3<0:1> matches the individual chip control code SLICE_ctrl<0:1>.

Figure 6:
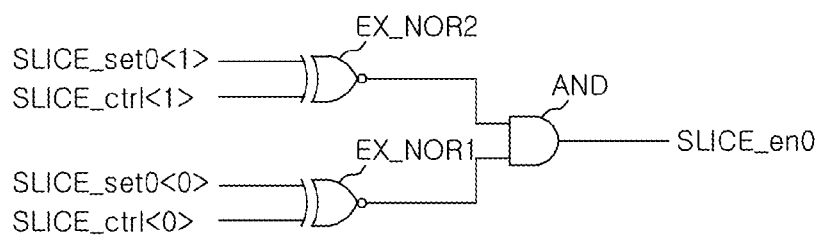
FIG. 6 is a configuration diagram of the first comparison unit of FIG. 5.

FIG. 6 is a configuration diagram of the first comparison unit 210 of FIG. 5. The configurations of the first to fourth comparison units 210 to 240 are the same except that signals inputted thereto and outputted therefrom are different.

The first comparison unit 210 includes first and second exclusive NOR gates EX_NOR1 and EX_NOR2, and an AND gate AND. The first exclusive NOR gate EX_NOR1 receives the first bit SLICE_set0<0> of the first individual chip designating codes SLICE_set0<0:1> and the first bit SLICE_ctrl<0> of the individual chip control codes SLICE_ctrl<0:1>. The second exclusive NOR gate EX_NOR2 receives the second bit SLICE_set0<1> of the first individual chip designating codes SLICE_set0<0:1> and the second bit SLICE_ctrl<1> of the individual chip control codes SLICE_ctrl<0:1>. The AND gate AND receives the output signals of the first and second exclusive NOR gates EX_NOR1 and EX_NOR2 and outputs the first individual chip activation signal SLICE_en0.

Figure 7:
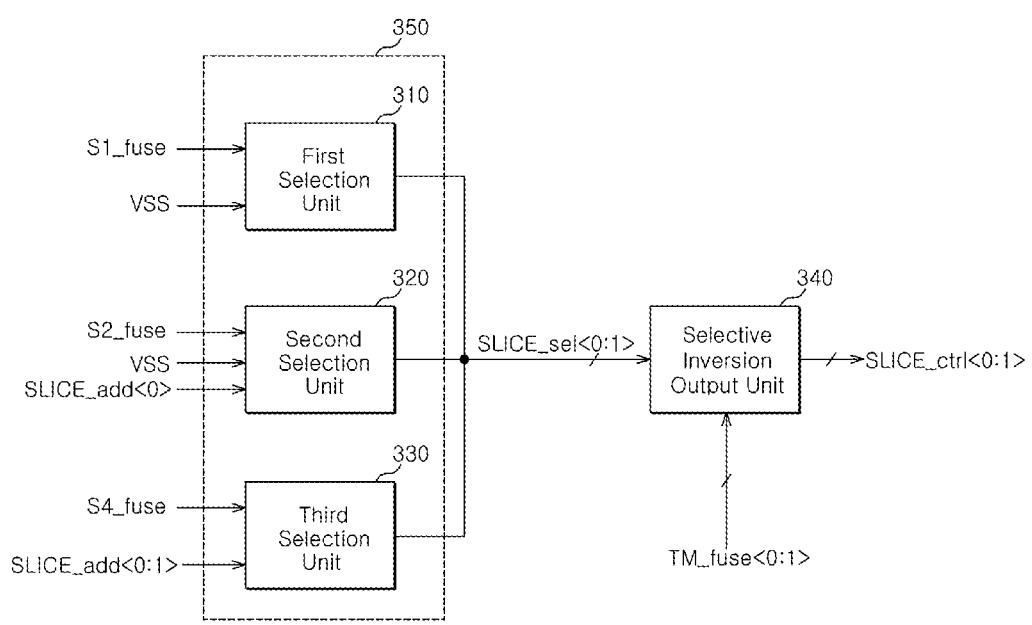
FIG. 7 is a block diagram illustrating the control block shown in FIG. 1.

FIG. 7 is a block diagram illustrating the control block shown in FIG. 1. Referring to FIG. 7, the control block 300 includes first through third selection units 310-330 and a selective inversion output unit 340.

The first selection unit 310 is configured to fix all the bits of the selection code SLICE_sel<0:1> to a specified level when the first chip selection fuse signal S1_fuse is enabled. For example, the first selection unit 310 fixes all the bits of the selection code SLICE_sel<0:1> to the level of a ground voltage VSS, that is, a low level, when the first chip selection fuse signal S1_fuse is enabled.

The second selection unit 320 is configured to fix one predetermined bit of the selection code SLICE_sel<0:1> to a specified level and output one bit of the chip selection address SLICE_add<0:1> as an unfixed bit of the selection code SLICE_sel<0:1> when the second chip selection fuse signal S2_fuse is enabled. For example, the second selection unit 320 fixes the bit SLICE_sel<1> of the selection code SLICE_sel<0:1> to the level of the ground voltage VSS, that is, a low level, and outputs the bit SLICE_sel<0> of the selection code SLICE_sel<0:1> as the address SLICE_add<0> of the chip selection address SLICE_add<0:1> when the second chip selection fuse signal S2_fuse is enabled.

The third selection unit 330 is configured to output the chip selection address SLICE_add<0:1> as the selection code SLICE_sel<0:1> when the third chip selection fuse signal S4_fuse is enabled. Since the first through third selection units 310-330 are configured to generate the selection code SLICE_sel<0:1>, they may be collectively referred to as a selection code generation circuit 350. As described above, the selection code generation circuit 350 performs an operation of setting the selection code SLICE_sel<0:1> in response to the first through third chip selection fuse signals S1_fuse, S2_fuse and S4_fuse, or outputs the chip selection address SLICE_add<0:1> as the selection code SLICE_sel<0:1>.

Hereafter, the test fuse signal TM_fuse<0> of the test fuse signals TM_fuse<0:1> will be referred to as a first test fuse signal TM_fuse<0>, and the test fuse signal TM_fuse<1> will be referred to as a second test fuse signal TM_fuse<1>.

The selective inversion output unit 340 is configured to invert or maintain one bit of the selection code SLICE_sel<0:1> and output the inverted or non-inverted bit as one bit of the individual chip control code SLICE_ctrl<0:1>, in response to the first test fuse signal TM_fuse<0>, and invert or maintain the other bit of the selection code SLICE_sel<0:1> and output the inverted or non-inverted bit as the other bit of the individual chip control code SLICE_ctrl<0:1>, in response to the second test fuse signal TM_fuse<1>. For example, the selective inversion output unit 340 inverts or does not invert the selection code SLICE_sel<0> of the selection code SLICE_sel<0:1> and outputs the inverted or non-inverted selection code SLICE_sel<0> as the first bit of the individual chip control code SLICE_ctrl<0:1>, i.e., SLICE_ctrl<0>, in response to the first test fuse signal TM_fuse<0>. Also, the selective inversion output unit 340 inverts or does not invert the selection code SLICE_sel<1> of the selection code SLICE_sel<0:1> and outputs the inverted or non-inverted selection code SLICE_sel<1> as the second bit of the individual chip control code SLICE_ctrl<0:1>, i.e., SLICE_ctrl<1>, in response to the second test fuse signal TM_fuse<1>.

Figure 8:
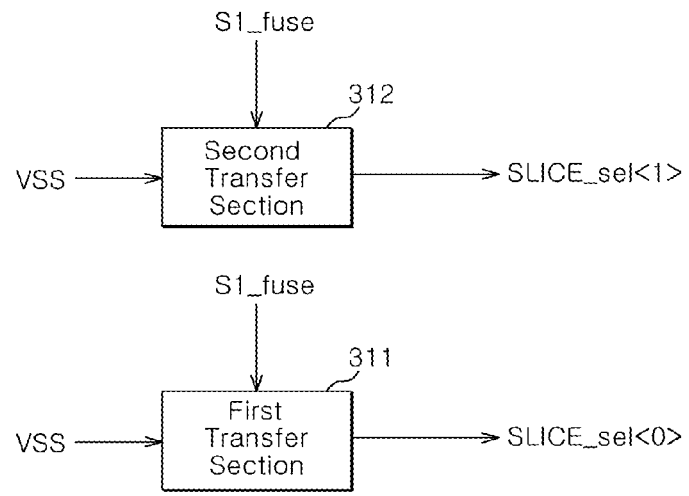
FIG. 8 is a block diagram illustrating the first selection unit shown in FIG. 7.

FIG. 8 is a block diagram illustrating the first selection unit shown in FIG. 7. Referring to FIG. 8, the first selection unit 310 includes first and second transfer sections 311 and 312. The first transfer section 311 is configured to output the ground voltage VSS as the voltage level of the first bit of the selection code SLICE_sel<0:1>, i.e., SLICE_sel<0>, when the first chip selection fuse signal S1_fuse is enabled. The second transfer section 312 is configured to output the ground voltage VSS as the voltage level of the second bit of the selection code SLICE_sel<0:1>, i.e., SLICE_sel<1>, when the first chip selection fuse signal S1_fuse is enabled.

Figure 9:
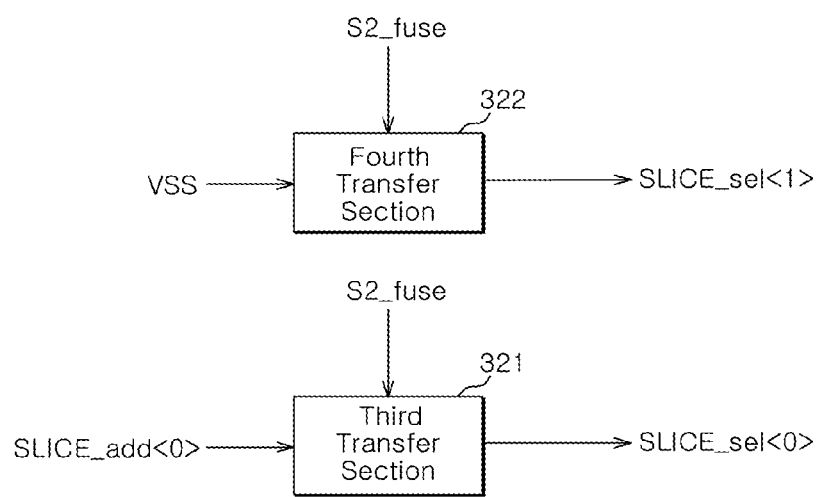
FIG. 9 is a block diagram illustrating the second selection unit shown in FIG. 7.

FIG. 9 is a block diagram illustrating the second selection unit shown in FIG. 7. Referring to FIG. 9, the second selection unit 320 includes third and fourth transfer sections 321 and 322. The third transfer section 321 is configured to output the first bit of the chip selection address SLICE_add<0:1>, i.e., SLICE_add<0>, as the first bit of the selection code SLICE_sel<0:1>, i.e., SLICE_sel<0>, when the second chip selection fuse signal S2_fuse is enabled. The fourth transfer section 322 is configured to output the ground voltage VSS as the second bit of the selection code SLICE_sel<0:1>, i.e., SLICE_sel<1>, when the second chip selection fuse signal S2_fuse is enabled.

Figure 10:
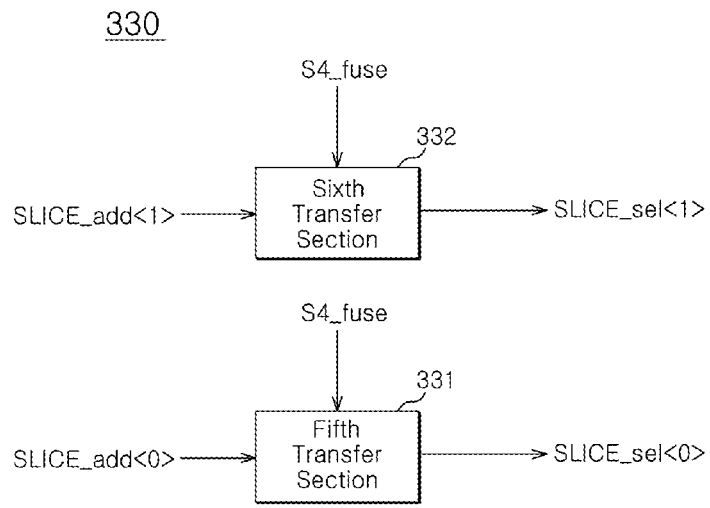
FIG. 10 is a block diagram illustrating the third selection unit shown in FIG. 7.

FIG. 10 is a block diagram illustrating the third selection unit shown in FIG. 7. Referring to FIG. 10, the third selection unit 330 includes fifth and sixth transfer sections 331 and 332. The fifth transfer section 331 is configured to output the first bit of the chip selection address SLICE_add<0:1>, i.e., SLICE_add<0>, as the first bit of the selection code SLICE_sel<0:1>, i.e., SLICE_sel<0>, when the third chip selection fuse signal S4_fuse is enabled. The sixth transfer section 332 is configured to output the second bit of the chip selection address SLICE_add<0:1>, i.e., SLICE_add<1>, as the second bit of the selection code SLICE_sel<0:1>, i.e., SLICE_sel<1>, when the third chip selection fuse signal S4_fuse is enabled. The first through sixth transfer sections 311, 312, 321, 322, 331 and 332 shown in FIGS. 4-6 can be realized using pass gates, which are generally known in the art.

Figure 11:
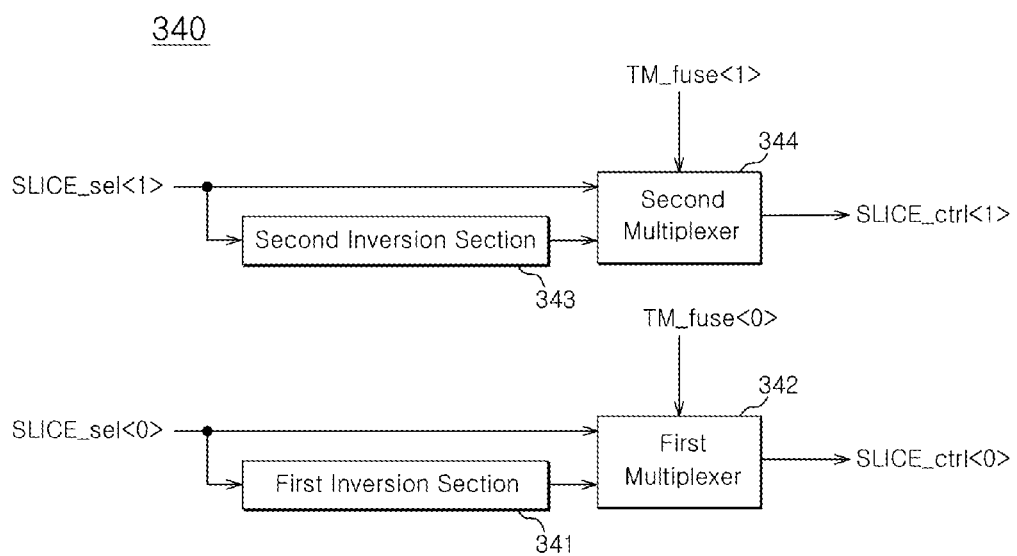
FIG. 11 is a block diagram illustrating the selective inversion output unit shown in FIG. 7.

FIG. 11 is a block diagram illustrating the selective inversion output unit shown in FIG. 7. Referring to FIG. 11, the selective inversion output unit 340 includes a first inversion section 341, a first multiplexer 342, a second inversion section 343, and a second multiplexer 344.

The first inversion section 341 is configured to invert and output the first bit of the selection code SLICE_sel<0:1>, i.e., SLICE_sel<0>.

The first multiplexer 342 is configured to select one of the first bit of the selection code SLICE_sel<0:1>, i.e., SLICE_sel<0>, and the output of the first inversion section 341, and output the selected one as the first bit of the individual chip control code SLICE_ctrl<0:1>, i.e., SLICE_ctrl<0>, in response to the first test fuse signal TM_fuse<0> of the test fuse signals TM_fuse<0:1>.

The second inversion section 343 is configured to invert and output the second bit of the selection code SLICE_sel<0:1>, i.e., SLICE_sel<1>.

The second multiplexer 344 is configured to select one of the second bit of the selection code SLICE_sel<0:1>, i.e., SLICE_sel<1>, and the output of the second inversion section 343, and output the selected one as the second bit of the individual chip control code SLICE_ctrl<0:1>, i.e., SLICE_ctrl<1>, in response to the second test fuse signal TM_fuse<1> of the test fuse signals TM_fuse<0:1>.

The operations of the semiconductor apparatus in accordance with the embodiment of the present invention, configured as mentioned above, will be described below.

The first through fourth individual chip activation signals SLICE_en0-SLICE_en3 are signals for respectively activating first through fourth individual chips (not shown).

The individual chip designating code setting block 100 shown in FIG. 1 sets the code values of the first through fourth individual chip designating codes SLICE_set0<0:1>-SLICE_set3<0:1>. For example, the code values are set such that the first individual chip designating code SLICE_set0<0:1> has a code value of 00, the second individual chip designating code SLICE_set1<0:1> has a code value of 01, the third individual chip designating code SLICE_set2<0:1> has a code value of 10, and the fourth individual chip designating code SLICE_set3<0:1> has a code value of 11.

The operation of the semiconductor apparatus in accordance with the embodiment of the present invention, in which the first through fourth individual chips have not failed, is described below.

The third chip selection fuse signal S4_fuse is enabled.

When the third chip selection fuse signal S4_fuse is enabled, the chip selection address SLICE_add<0:1> is outputted as the selection code SLICE_sel<0:1>, and the selection code SLICE_sel<0:1> is non-inverted and outputted as the individual chip is control code SLICE_ctrl<0:1> in response to the test fuse signals TM_fuse<0:1>.

The individual chip activation block 200 enables the first individual chip activation signal SLICE_en0 when the individual chip control code SLICE_ctrl<0:1>, i.e., the chip selection address SLICE_add<0:1>, matches the first individual chip designating code SLICE_set0<0:1>.

The individual chip activation block 200 enables the second individual chip activation signal SLICE_en1 when the chip selection address SLICE_add<0:1> matches the second individual chip designating code SLICE_set1<0:1>.

The individual chip activation block 200 enables the third individual chip activation signal SLICE_en2 when the chip selection address SLICE_add<0:1> matches the third individual chip designating code SLICE_set2<0:1>.

The individual chip activation block 200 enables the fourth individual chip activation signal SLICE_en3 when the chip selection address SLICE_add<0:1> matches the fourth individual chip designating code SLICE_set3<0:1>.

When any one of the first through fourth individual chips has failed, only one individual chip or two individual chips can be used.

First, a method of using only one individual chip will be described.

The first chip selection fuse signal S1_fuse is enabled.

When the first chip selection fuse signal S1_fuse is enabled, the value of the selection code SLICE_sel<0:1> is fixed to 00 regardless of the chip selection address SLICE_add<0:1>.

The selection code SLICE_sel<0:1>, which is fixed to the code value of 00 according to the test fuse signals TM_fuse<0:1>, is outputted as the individual chip control code SLICE_ctrl<0:1>, which has a code value fixed to one of 00, 01, 10, and 11. In other words, only one of the first through fourth individual chip activation signals SLICE_en0 through SLICE_en3 is enabled according to the test fuse signals TM_fuse<0:1>, regardless of the chip selection address SLICE_add<0:1>.

As a result, if the first individual chip has failed, only one of the second through fourth individual chips is enabled, regardless of the chip selection address SLICE_add<0:1>.

Next, a method of using two individual chips will be described.

The second chip selection fuse signal S2_fuse is enabled.

When the second chip selection fuse signal S2_fuse is enabled, the second bit of the selection code SLICE_sel<0:1>, i.e., SLICE_sel<1>, is fixed to a low level, and the first bit of the chip selection address SLICE_add<0:1>, i.e., SLICE_add<0>, is outputted as the first bit of the selection code SLICE_sel<0:1>, i.e., SLICE_sel<0>. The second bit of the selection code SLICE_sel<0:1>, i.e., SLICE_sel<1>, is fixed to the specified level regardless of the chip selection address SLICE_add<0:1>, and the value of the first bit of the selection code SLICE_sel<0:1>, i.e., SLICE_sel<0>, is determined by the first bit of the chip selection address SLICE_add<0:1>, i.e., SLICE_add<0>.

The selection code SLICE_sel<0:1>, whose value is determined in this manner, is outputted as the individual chip control code SLICE_ctrl<0:1> in response to the test fuse signals TM_fuse<0:1>. For example, to use the first and second individual chips, by setting the voltage levels of the test fuse signals TM_fuse<0:1> and not inverting the second bit of the selection code SLICE_sel<0:1>, i.e., SLICE_sel<1>, the value of the second bit of the individual chip control code SLICE_ctrl<0:1>, i.e., SLICE_ctrl<1>, is fixed to the low level, and the value of the first bit of the individual chip control code SLICE_ctrl<0:1>, i.e., SLICE_ctrl<0>, is changed according to the first bit of the chip selection address SLICE_add<0:1>, i.e., SLICE_add<0>. To use the third and fourth individual chips, by setting the voltage levels of the test fuse signals TM_fuse<0:1> and inverting the second bit of the selection code SLICE_sel<0:1>, i.e., SLICE_sel<1>, the value of the second bit of the individual chip control code SLICE_ctrl<0:1>, i.e., SLICE_ctrl<1>, is fixed to the high level, and the value of the first bit of the individual chip control code SLICE_ctrl<0:1>, i.e., SLICE_ctrl<0>, is changed according to the first bit of the chip selection address SLICE_add<0:1>, i.e., SLICE_add<0>.

In the semiconductor apparatus in accordance with the embodiment, the four individual chip activation signals are selectively enabled. When the second chip selection fuse signal S2_fuse is enabled, since the second bit of the selection code SLICE_sel<0:1>, i.e., SLICE_sel<1>, is fixed to the specified level, two of the four individual chip activation signals may be selected by the first bit of the chip selection address SLICE_add<0:1>, i.e., SLICE_add<0>, and by inverting or not inverting the second bit of the selection code SLICE_sel<0:1>, i.e., SLICE_sel<1>, which has a fixed level, a first group (including the first and second individual chip activation signals) and a second group (including the third and fourth individual chip activation signals) may be selected.

As is apparent from the above description, in the semiconductor apparatus in accordance with the embodiment, even when at least one individual stacked chip has failed, the remaining chips may be used, which improves the efficiency and productivity of the semiconductor apparatus. The chip selection fuse signals S1_fuse, S2_fuse and S4_fuse and the test fuse signals TM_fuse<0:1>, which are used in the embodiment of the present invention, may be applied from external test equipment to the semiconductor apparatus and their levels determined by fuse cutting.

While certain embodiments have been described above, it will be understood to those skilled in the art that the embodiments described are by way of example only. Accordingly, the semiconductor apparatus and the chip selection method thereof described herein should not be limited based on the described embodiments. Rather, the semiconductor apparatus and the chip selection method thereof described herein should only be limited in light of the claims that follow when taken in conjunction with the above description and accompanying drawings.

What is claimed is:
1. A semiconductor apparatus comprising:
an individual chip designating code setting circuit configured to generate a plurality of individual chip designating codes of different values in response to a plurality of start codes generated by shifting a start pulse in response to a clock;
an individual chip activation circuit configured to receive the plurality of individual chip designating codes and an individual chip control code, enable one individual activation signal among a plurality of individual chip activation signals in response to the individual chip designating code and the individual chip control code; and
a control circuit configured to receive a chip selection address, chip selection fuse signals, test fuse signals, and output the individual chip control code being set in response to the chip selection fuse signals and the test fuse signals or output the chip selection address as the individual chip control code in response to the chip selection fuse signals and the test fuse signals
wherein the individual chip activation circuit performs an operation that matches the individual chip designating codes with the individual chip control code, and enables one individual activation signal according to a result of the operation.

2. The semiconductor apparatus according to claim 1, wherein the individual chip designating code setting circuit generates the individual chip designating code having the same number of bits.

3. The semiconductor apparatus according to claim 1, wherein the individual chip activation circuit comprises a plurality of comparison units that are configured to compare the individual chip designating code and the individual chip control code, and generate the individual chip activation signals.

4. The semiconductor apparatus according to claim 1, wherein the control circuit comprises:
a selection code generation circuit configured to set a selection code or output the plurality of chip selection address as the selection code in response to the chip selection fuse signals; and
a selective inversion output unit configured to invert a predetermined bit of the selection code in response to the test fuse signals, and generate the individual chip control code from at least the inverted bit of the selection code.

5. The semiconductor apparatus according to claim 4, wherein the chip selection fuse signals comprise first through third chip selection fuse signals and the selection code comprises 2 bits, and
wherein the selection code generation circuit comprises:
a first selection unit configured to fix all bits of the selection code to a specified level when the first chip selection fuse signal is enabled;
a second selection unit configured to fix one predetermined bit of the selection code to the specified level and output one of the chip selection address as an unfixed bit of the selection code when the second chip selection fuse signal is enabled; and
a third selection unit configured to output the chip selection address as the selection code when the third chip selection fuse signal is enabled.

6. The semiconductor apparatus according to claim 5, wherein the second selection unit fixes a most significant bit of the selection code to a specified level and outputs a least significant bit address of the chip selection address as a least significant bit of the selection code when the second chip selection fuse signal is enabled.

7. The semiconductor apparatus according to claim 4, wherein the selection code comprise 2 bits and the test fuse signals comprise first and second test fuse signals, and wherein the selective inversion output unit inverts or does not invert one bit of the selection code and outputs the inverted or non-inverted bit as one bit of the individual chip control code, in response to the first test fuse signal, and inverts or does not invert the other bit of the selection code and outputs the inverted or non-inverted bit as the other bit of the individual chip control code, in response to the second test fuse signal.

8. The semiconductor apparatus according to claim 7, wherein the selective inversion output unit comprises:
   a first inversion section configured to receive one bit of the selection code;
   a second inversion section configured to receive the other bit of the selection code;
   a first multiplexer configured to output one bit of the selection code or an output signal of the first inversion section as one bit of the individual chip control code, in response to the first test fuse signal;
   a second multiplexer configured to output the other bit of the selection code or an output signal of the second inversion section as the other bit of the individual chip control code, in response to the second test fuse signal.

9. The semiconductor apparatus according to claim 1, wherein the individual chip designating code setting circuit comprises:
   a shifting unit configured to receive the clock and the start pulse and generate the plurality of start codes of different values,
   an encoding unit configured to encode the plurality of start codes and generate a plurality of activation codes of different values, and
   a latch unit configured to latch the plurality of activation codes and output the plurality of individual chip designating codes.

* * * * *